United States Patent [19]
Jordan et al.

[11] 3,983,458
[45] Sept. 28, 1976

[54] ELECTRICAL DEVICE ASSEMBLY AND METHOD

[75] Inventors: Lester J. Jordan, Smethport; Steve Platko, Bradford, both of Pa.

[73] Assignee: Corning Glass Works, Corning, N.Y.

[22] Filed: July 21, 1971

[21] Appl. No.: 164,747

[52] U.S. Cl. ................... 317/101 CP; 174/52 PE; 174/68.5; 339/17 C
[51] Int. Cl.² ........................................ H05K 1/18
[58] Field of Search .................. 174/52 R, 52 PE; 317/101 CP, 101 CN, 101 CC, 101 CM; 338/310, 332, 317; 339/17 C, 17 R

[56] References Cited
UNITED STATES PATENTS

| | | | |
|---|---|---|---|
| 2,586,854 | 2/1952 | Myers | 174/68.5 UX |
| 3,134,930 | 5/1964 | Wright, Jr. | 317/101 CW |
| 3,142,783 | 7/1964 | Warren | 317/101 CP |
| 3,192,307 | 6/1965 | Lazar | 317/101 CP X |

FOREIGN PATENTS OR APPLICATIONS

| | | | |
|---|---|---|---|
| 1,249,108 | 10/1971 | United Kingdom | 317/101 CP |
| 1,266,632 | 3/1972 | United Kingdom | 317/101 CP |

*Primary Examiner*—Bruce A. Reynolds
*Attorney, Agent, or Firm*—Walter S. Zebrowski; Clarence R. Patty, Jr.

[57] ABSTRACT

An electrical device assembly wherein a plurality of electrical components or conductors having opposing terminal ends are disposed within apertures in a flat dielectric substrate, at least one of the terminal ends of selected components or conductors extending beyond a flat surface of the substrate. Metallic members are affixed to the extending terminal ends of selected components or conductors at one or both of the flat surfaces of the substrate while at least one conductive path is formed on one or both flat surfaces electrically connecting selected ones of the component or conductor terminal ends in a desired manner. The components may be passive components such as electrical resistors, capacitors, inductors, and the like, or active components such as diodes, transistors, and the like. The components and conductors may be maintained within the substrate apertures by means of friction, by means of a dielectric sealing compound, or by means of wedges. The entire assembly is then encapsulated in a suitable dielectric encapsulant, the excess portions of the metallic members are removed, and the members may be bent or otherwise formed in any desired manner as, for example, to form plug-in leads.

32 Claims, 16 Drawing Figures

INVENTORS.
Lester J. Jordan
Steve Platko
BY Walter S. Zebrowski
ATTORNEY

ELECTRICAL DEVICE ASSEMBLY AND METHOD

BACKGROUND OF THE INVENTION

1. Field of the Invention

This invention deals with electrical circuits or networks incorporating a plurality of electrical components and conductors encapsulated in a manner so that only leads extend beyond the encapsulant.

2. Description of the Prior Art

Ordinarily, discrete electrical components such as resistors, capacitors, inductors, transistors, diodes, and the like have been attached to perforated printed circuits or hybrid microcircuits by taking leads of the components, suitably bending them, inserting them in the perforated conductive paths and substrate, and thereafter soldering or otherwise electrically bonding the leads to the conductive paths. The wire leads would form both the structural support for the components as well as the electrical connection to the various conductors within the circuit. Such components would stand-off from the surface of the circuit substrate and would substantially increase the space necessary for housing the circuit. Also, such components have been subject to damage because they protrude from the substrate surface. Certain of such circuits have been encapsulated by any one of numerous heretofore known methods but resulted in bulky packages and the components were subject to damage during encapsulation.

SUMMARY OF THE INVENTION

Briefly, according to the present invention a device or assembly is provided comprising a flat dielectric substrate having a plurality of apertures communicating between the flat surfaces thereof. A leadless electrical component, having opposing terminal ends, is disposed within each of at least two of the apertures with at least one of the terminal ends of selected components extending beyond a flat surface of the substrate. The components are maintained within the substrate apertures by friction, by means of a dielectric sealing compound or by means of wedges. Metallic members are affixed to the extending terminal ends of all or selected ones of the components. On either flat surface of the substrate one or more conductive paths may be formed for electrically interconnecting selected ones of the thereat exposed component terminal ends in any desired manner. Conductors may be disposed within selected ones of said apertures and be interconnected connected with said components in the same manner as the components are disposed and interconnected. The metallic members may be provided in the form of a grid-like structure having interconnecting portions which are subsequently removed leaving the metallic members extending beyond the edges of the dielectric substrate. The substrate with the electrical components and any conductors thusly connected is suitably encapsulated as, for example, by molding a dielectric encapsulant thereabout so that only the metallic members extend beyond the molded surface. Any form of encapsulation known in the art that would not deleteriously affect the components may be used. The interconnecting portions of the grid may be removed after encapsulation. Those portions of the metallic members that extend beyond the encapsulant comprise the means for providing external electrical connection to the encapsulated components. These extending portions of the metallic members may be bent or formed in any suitable manner so as to, for example, form a plug-in device wherein the metallic members comprise the plug-in leads.

The objects of the present invention are to provide a simple, economic, and direct means for attaching and connecting discrete electrical components to form an electrical circuit, network, or the like, wherein the resulting assembly eliminates the requirement for soldering, is sturdy, is one whose overall size and cost of production is significantly less than heretofore known, and is one which overcomes the hereinabove noted disadvantages.

Additional objects, features, and advantages of the present invention will become apparent to those skilled in the art from the following detailed description and the attached drawings on which, by way of example, only the preferred embodiments of this invention are illustrated.

DETAILED DESCRIPTION

Figure 1:
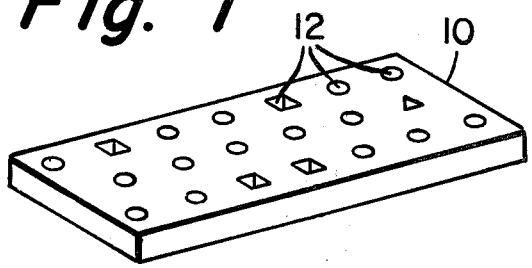
FIG. 1 is an oblique illustration of the apertured dielectric substrate of the present invention.

The present invention will be described in connection with the device illustrated in the drawings, however, it is to be understood that the specific embodiments illustrated are not necessarily limitations on the present electrical device and method. Referring to FIG. 1, there is shown dielectric substrate 10 having a plurality of aperture 12 formed therein. Substrate 10 may be formed of any suitable dielectric material such as glass, glass-ceramics, ceramics, synthetic resins, other plastics, and the like. Suitable synthetic resins are either thermosetting or thermoplastic resins including epoxies, alkyds, polysulfone, or the like. Apertures 12 extend through substrate 10 from the flat surface thereof to the other. Depending on the material of substrate 10 and method of fabricating it, apertures 12 may be formed by any suitable means, such as molding, punching, drilling, and the like. Apertures 12 may be of any shape, such for example as round, elliptical, square, rectangular, triangular, and the like, with the size and shape being dependent upon the size and shape of the electrical component to be accommodated as hereinafter described.

Figure 2:
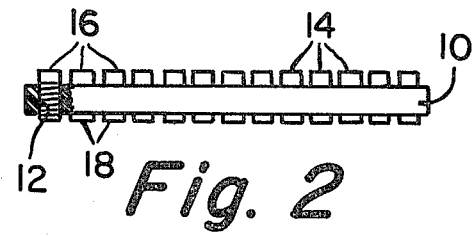
FIG. 2 is an elevation partly in cross-section illustrating electrical components disposed within the substrate apertures.

FIG. 2 illustrates a plurality of electrical components 14 disposed within apertures 12. Electrical components 14 may be any passive or active components such as electrical resistors, capacitors, inductors, diodes, transistors, and the like. Some specific examples of such components are metal oxide film resistors, metal film resistors, bulk resistors, stacked capacitors, and the like. Components 14 may be capless and are leadless having opposing terminal ends 16 and 18. Each aperture 12 is formed having a size and shape, in relation to the electrical component to be accommodated, such that when the desired component is disposed within such aperture, it is snugly and rigidly held in place directly by friction, by means of a wedge of wedges disposed at the periphery thereof, or by means of a sealing compound. The component may also be held in place by the combination of wedges and sealing compound.

The sealing compound is not critical as long as it is compatible with the substrate and the electrical component, and firmly holds the component in place. It is preferably a good dielectric such, for example, as an epoxy, alkyd, or the like. A particularly suitable sealing compound is Epoxy No. A-298 by the Armstrong Corporation.

Selected ones of the opposing terminal end of components 14 extend beyond the flat surfaces of substrate 10. The description herein as to sizes, shapes, location and disposition within the apertures, maintaining within apertures, and connections thereto applies equally to components as well as conductors hereinafter described. If component 14 is a more than two terminal component, such for example as a transistor, a pair of terminals may be formed at one end thereof and connected as hereinafter described.

Figure 4:
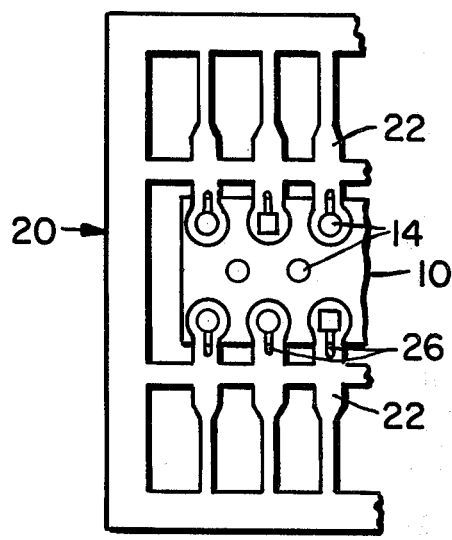
FIG. 4 is a fragmentary plan view of the metallic grid structure of FIG. 3 attached to selected component terminal ends at one surface of the dielectric substrate.
Figure 3:
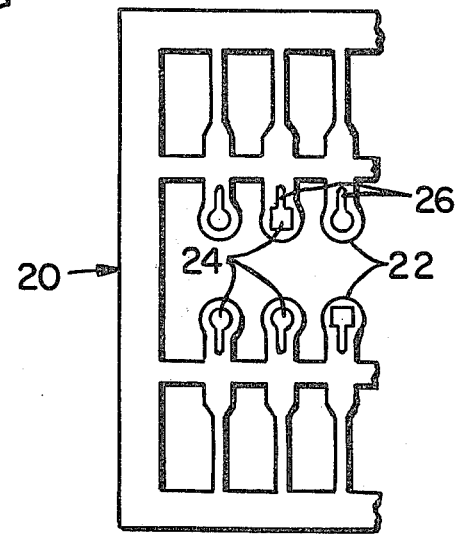
FIG. 3 is a fragmentary plan view of a metallic grid structure for interconnecting electrical components.

A metallic grid 20 is prepared having a plurality of metallic members 22 embodied therein as illustrated in FIG. 3. The inner ends of metallic members 22 have holes 24 formed therein, which holes correspond in size and shape to the terminal ends of the components to which they will be attached, however, other accommodating hole shapes may be used as hereinafter described. Grid member 20 is formed with metallic members 22 arranged in such a manner that holes 24 thereof correspond to the desired arrangement of electrical components 14 in substrate 10, whereby metallic members 22 may be fitted over the terminal ends of selected components 14 as illustrated in FIG. 4. Members 22 are caused to have a tight friction fit over the terminal ends of the components thereby making good structural and electrical connection therewith. To facilitate such a friction fit, notches 26 may be provided extending from holes 24 to permit a spring-like grip of such members about the terminal ends of components 14.

Figure 5:
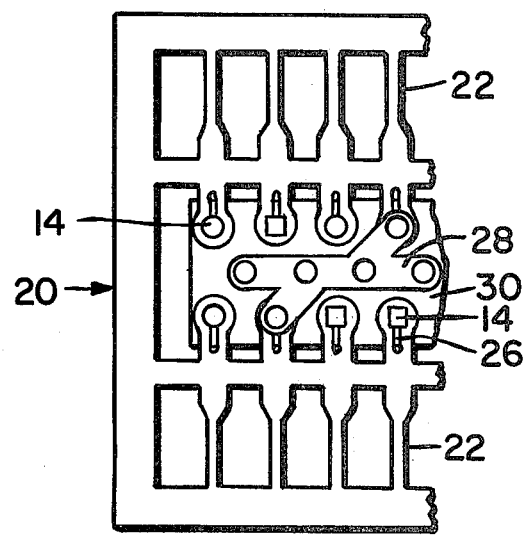
FIG. 5 is a fragmentary plan view illustrating additional electrical connections between selected component terminal ends at one surface of the dielectric substrate.
Figure 6:
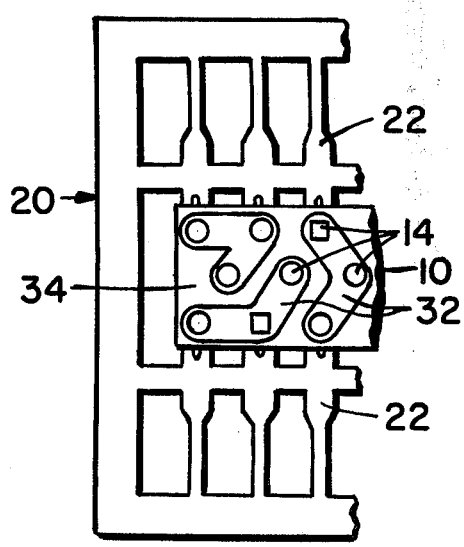
FIG. 6 is a fragmentary plan view illustrating desired electrical connections between selected components at the other surface of the dielectric substrate.

The metallic members of grid 20 are illustrated in FIG. 4 as making terminal connections only to the peripheral rows of components 14 in substrate 10, with the interior components in substrate 10 not being connected to such members. As will be understood, components 14 may be suitably positioned and/or members 22 be suitably shaped so that the members make terminal connections with any selected components or with all components, both those located at the periphery of substrate 10 as well as those located in the interior thereof, without overlapping or electrical contact between such members. However, as to the embodiment of FIG. 4, the interior components may be connected to metallic members 22 to form a desired network or circuit in the manner illustrated in FIG. 5. As shown therein, conductive path 28 is formed on surface 30 of substrate 10 to interconnect any selected ones of the various components with each other and with metallic members 22 in any desired manner. Conductive path 28 may be formed of any suitable conductive material, such as silver paint, conductive epoxy, copper plating, and the like. A particularly suitable material for conductive path 28 is silver spray paint No. 5815 by the E. I. DuPont de Nemours and Co., Inc. comprising butyl cellosolve as a thinner, particulate metallic silver, and a binder. Such a silver composition may be applied by silk screening, dipping, spraying, printing or any other suitable means, and thereafter dried or otherwise cured. The conductive paths could also be formed by a hot or cold release decalcomania or by means of a metal frame which connects to the extending ends of the components in the same manner as metallic members 22. Other suitable electroconductive compositions having a resistivity of up to about 0.20 ohm per square are described in U.S. Pat. No. 3,484,284 to H. F. Dates, et al. As will be understood, one or more conductive paths 28 may be shaped in any desired manner to make desired interconnections between the various components and members 22.

Similarly, conductive paths 32 may be formed on the other flat surface 34 of substrate 10 to interconnect selected ones of the opposing terminal ends of components 14 with each other in any desired manner. Conductive paths 32 may be formed of the same material and in the same manner as conductive path 28 or may be of different material applied in a different manner.

Figure 7:
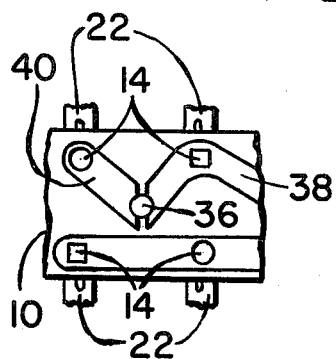
FIG. 7 is a fragmentary plan view illustrating desired electrical connections between selected components including a component having more than one terminal connection at one end.

Referring now to FIG. 7, a component having more than two terminals, such, for example, as three terminal transistor 36, is illustrated. Connection may be made to the first two terminals of transistor 36 in a similar manner to that described hereinabove. For example, conductive path 38 may be formed so that it contacts only that portion of the terminal end of transistor 36 which forms one of the transistor electrodes whereas conductive path 40 may be formed so that it contacts that other portion of the terminal end of transistor 36 which forms the electrode of a second element thereof. Contact may be made with the third electrode of transistor 36 at the opposing terminal end thereof as described hereinabove in connection with two terminal components. Other multiple terminal components may be connected in a similar manner.

It is to be understood that, when greater flexibility of circuit or network design is desired, a conductor may be inserted into any one or more selected apertures 12 of substrate 10 rather than an active or passive electrical component. Such a conductor could be solid or tubular wire or rod, solder, conductive resin or the like. If such a conductor is a solid or tubular member, it could be inserted into the substrate and held therein in the same manner as a component. If suitable contact could be made to the terminal ends thereof, such a conductor would not have to extend beyond the flat surfaces of the substrate. This, of course, is also true of the terminal end of any component. An extending terminal end is required when a metallic member or metal frame is affixed to either such a component or conductor.

Figure 8:
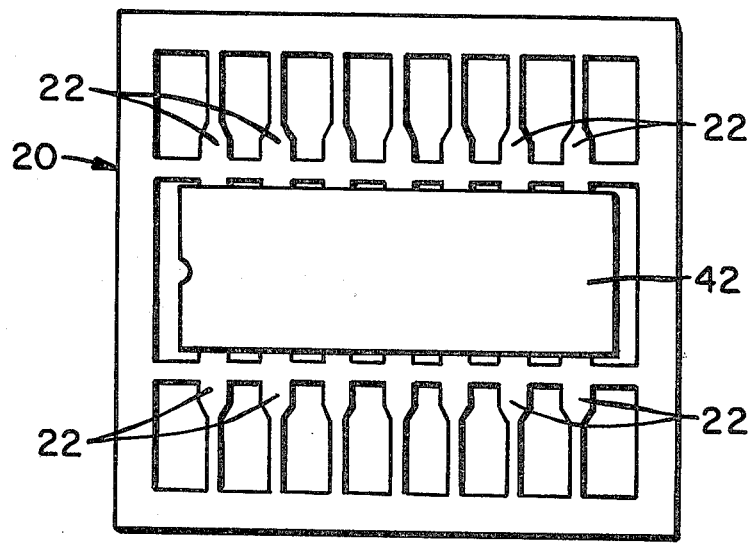
FIG. 8 is a plan view illustrating the sub-assembly of FIG. 5 and 6 after encapsulation.

After all interconnections are made as desired among the various electrical elements or components fitted into the apertures in dielectric substrate 10, the metallic members, and the conductive paths, the resulting assembly is encapsulated, as by molding enclosure 42 about the assembly so formed, in a manner such that only a portion of metallic members 22 protrude beyond the periphery of enclosure 42 as illustrated in FIG. 8. Although enclosure 42 is illustrated as being molded about the device, it is understood that it may be formed in any way known in the art such, for example, as spraying, dipping, sealing within a preformed container, and the like. The encapsulating material is a dielectric and may be any suitable material such as glass, glass-ceramics, ceramics, synthetic resins, other plastics, or the like. Suitable synthetic resins are either thermosetting or thermoplastic resins including epoxies, polysulfone, alkyds, or the like. Consideration must be given in the selection of a proper encapsulating material and method of encapsulation so that the electrical components are not deleteriously affected thereby.

Figure 10:
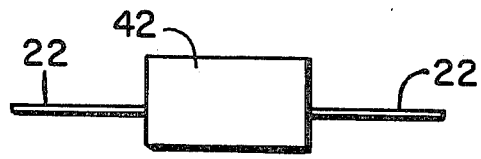
FIG. 10 is an end elevation of the structure illustrated in FIG. 9.
Figure 9:
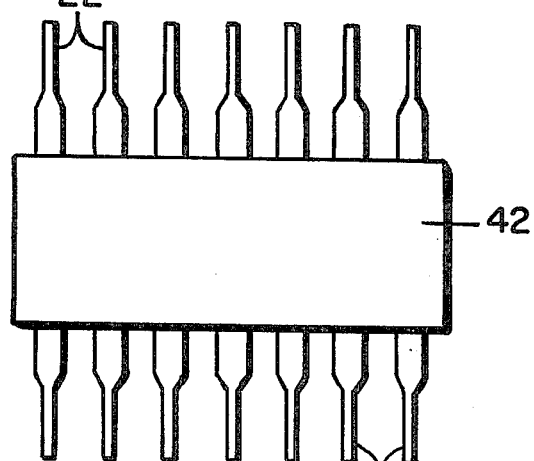
FIG. 9 is a plan view illustrating the encapsulated device of FIG. 8 after removal of these portions of the grid interconnectng the metallic members.

After grid 20 is suitably attached to the terminal ends of the electrical components disposed in substrate 10, the peripheral portion and any interconnecting portions of the grid may be removed leaving only metallic members 22 extending from the structure. As heretofore described, metallic members 22 provide the means for making electrical contact with the electrical components and circuitry within the enclosure. As will be understood, the peripheral and interconnecting portions of grid 20 may be removed at any time after the metallic member ends are securely attached to the components, however, it is preferred to remove these portions after the device is encapsulated as illustrated in FIGS. 8, 9, and 10.

Figure 11:
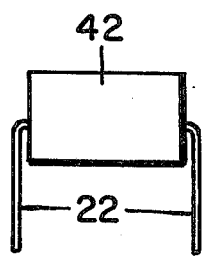
FIG. 11 is an end elevation of the structure of FIG. 9 after the leads are bent to form plug-in leads for the device.

After the peripheral and interconnecting portions of grid 20 are removed, metallic members 22 may be bent or otherwise formed in any desired shape, as shown in FIG. 11 for example, whereby they may be employed as plug-in leads. Metallic members 22 may be formed of any suitable conductive metal such as copper, silver, brass, aluminum, gold and the like.

Figure 12:
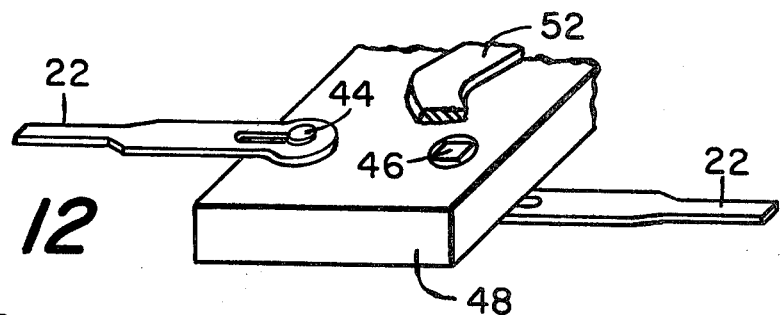
FIG. 12 is a fragmentary oblique illustration of another embodiment of the present invention.
Figure 13:
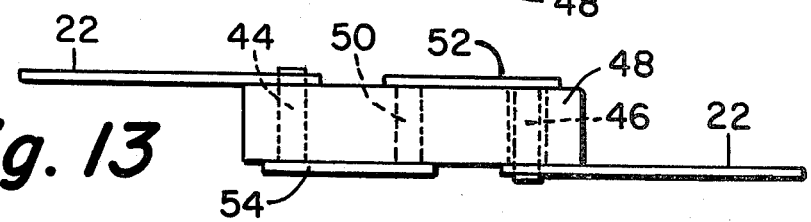
FIG. 13 is an end elevation of structure shown in FIG. 12.

An embodiment illustrating metallic members 22 attached to the terminal ends of components 44 and 46 at opposite sides of substrate 48 are shown in FIGS. 12 and 13. The embodiment illustrated in these figures also shows each of components 44 and 46 with only one protruding terminal and, namely the end to which metallic member 22 is attached, while each respective opposing end does not protrude beyond the surface of the substrate. In addition, conductor or component 50 is illustrated with terminal ends that do not protrude beyond either of the flat surfaces of substrate 48.

Component 46 is shown to be a square or rectangular component, such for example as a stacked capacitor, fitted within a round aperture in substrate 48. Such a component can be maintained rigidly in place by means of a sealing compound and/or one or more peripheral wedges as heretofore described. Electrical connection between the various components is achieved by means of conductive paths 52 and 54. In an embodiment such as that illustrated in FIGS. 12 and 13, electrical contact is made with the non-protruding terminal ends by conductive paths 52 and 54 being applied in contact with the terminal end surface of the component or conductor.

In an embodiment where a grid or metallic members are affixed to the terminal ends of selected components at both flat surfaces of the substrate, the grids or metallic members must be disposed and shaped in a manner so as to prevent undesired contact therebetween at all times and specifically if they are thereafter bent or otherwise formed for purposes such as making a plug-in device.

Figure 14:
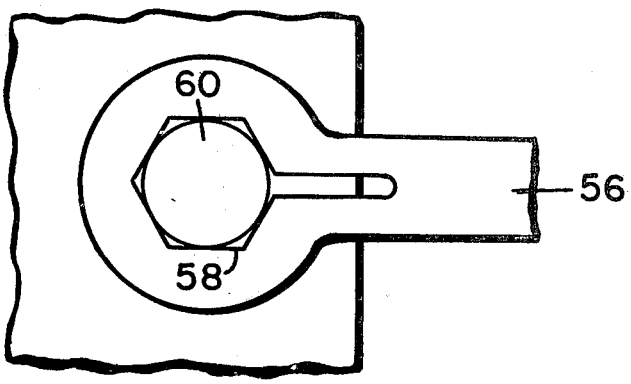
FIG. 14 is a fragmentary plan view illustrating another embodiment of a metallic member connected to an electric component.

FIG. 14 illustrates another embodiment of the present invention wherein metallic member 56 has a component mating hole 58 of a shape other than the shape of a component 60 to which it is affixed. It is seen that hole 58 being in the shape of a polygon, specifically a hexagon, can be readily made to effect good mechanical and electrical contact various shaped components. Similarly, a metallic member with a round hole can be employed with a square or rectangular component and the like. It is also seen that the selection of a properly shaped and sized hole in the metallic member is determined by the shape and size of the component to which it is attached.

Figure 15:
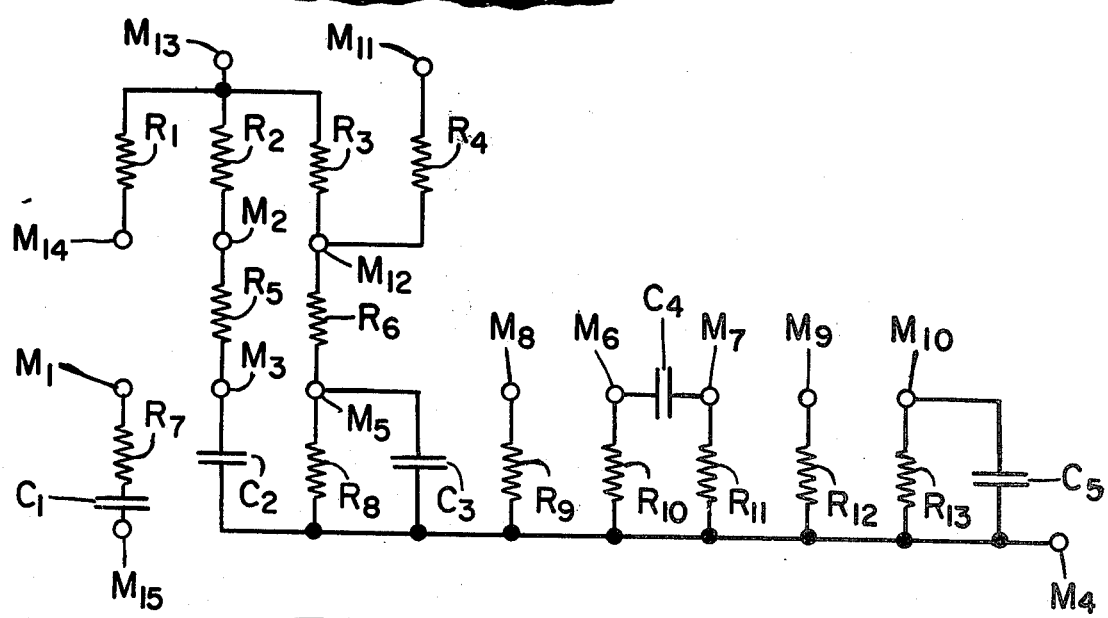
FIG. 15 is a schematic diagram illustrating a circuit formed in accordance with this invention.
Figure 16:
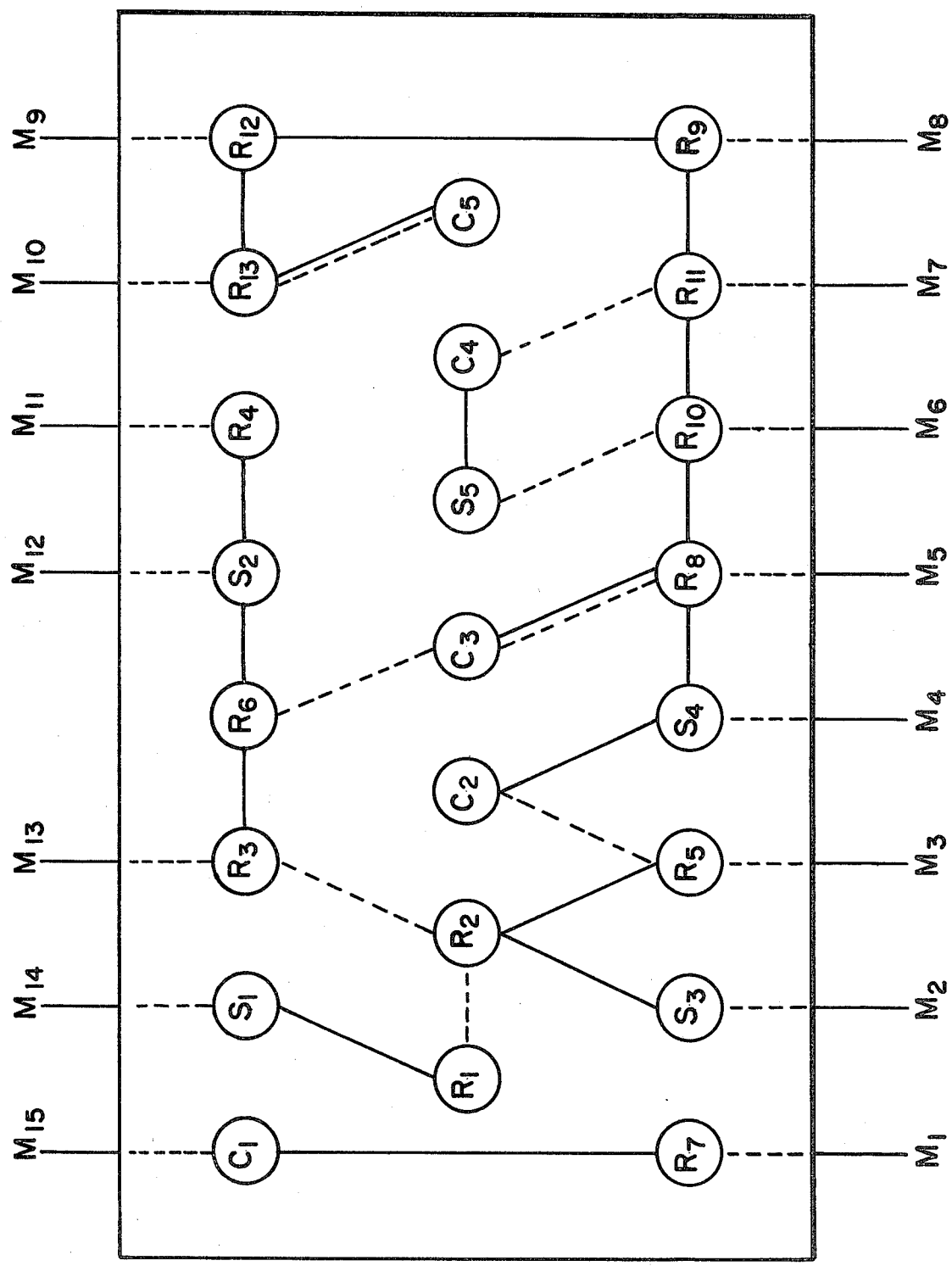
FIG. 16 is a partly schematic plan view of a device in accordance with the present invention illustrating electrical interconnections between components of the circuit of FIG. 15.

As a typical example of the present invention an RC circuit is illustrated in FIG. 15, the connections for which circuit are shown for both sides of a flat substrate in FIG. 16.

The 15 metallic members are designated by references $M_1$ through $M_{15}$, thirteen resistors by references $R_1$ through $R_{13}$, five capacitors by references $C_1$ through $C_5$, and five solid conductors by references $S_1$ through $S_5$. The electrical connections between the various components on the top surface of the substrate is indicated by the solid lines while the conductive paths on the bottom surface are indicated by dotted lines. When there is an electrical connection between components at both the top and bottom surfaces, one dotted line and one solid line is shown. Of course, the electrical connections between components as indicated in FIG. 16 may be either conductive paths, metallic grids, or the like as heretofore described.

Although the present invention has been described in respect to specific details of certain embodiments thereof, it is not intended that such details be limitations upon the scope of the invention except insofar as set forth in the following claims.

We claim:
1. A device comprising:
   a flat dielectric substrate having a plurality of apertures communicating between the flat surfaces thereof,
   a leadless electrical component having opposing terminal ends disposed within each of at least two of said apertures, with at least one of the terminal ends of selected components extending beyond at least one of said flat surfaces of said substrate, a plurality of metallic members each having an aperture therein accommodating one of the terminal ends of one of said electrical components, said metallic members being fixedly attached to the extending terminal ends of selected ones of said components adjacent at least one of the flat surfaces of said substrate, each metallic member providing an external electrical connection to one terminal of one component, and a conductive path disposed on at least one of the flat surfaces of said substrate electrically connecting terminal ends of selected ones of said components in a desired manner.

2. The device of claim 1 further comprising encapsulating means about the assembly so formed, portions of said metallic members extending beyond said encapsulating means.

3. The device of claim 2 wherein said encapsulating means comprise a molded enclosure of dielectric material.

4. The device of claim 1 wherein the size and shape of each said leadless electrical component and the corresponding aperture in said flat dielectric substrate is such that said component is rigidly maintained within said aperture solely by friction.

5. The device of claim 1 wherein each said component is rigidly maintained within a corresponding aperture by a dielectric sealing compound.

6. The device of claim 1 wherein each said component is rigidly maintained within a corresponding aperture by means of at least one wedge disposed about the periphery thereof.

7. The device of claim 1 wherein each said component is rigidly maintained within a corresponding aperture by a combination of at least one wedge disposed about the periphery thereof and a dielectric sealing compound.

8. The device of claim 1 wherein each said metallic member has a notch communicating with said aperture therein providing a spring-like grip of said member about the terminal end of said accommodated component.

9. The device of claim 1 wherein said conductive path is formed of silver paint.

10. The device of claim 1 wherein at least one of said leadless electrical components is an electrical conductor.

11. The device of claim 1 wherein at least one conductive path is formed on each of said flat surfaces of said substrate, each said conducting path electrically connecting certain terminal ends of selected ones of said components in a desired manner.

12. The device of claim 11 wherein the size and shape of each said leadless electrical component and the corresponding aperture in said flat dielectric substrate is such that said component is rigidly maintained within said aperture solely by friction, and wherein each said metallic member has an aperture therein to accommodate one of the terminal ends of one of said electrical components, further comprising encapsulating means about the assembly so formed, portions of said metallic members extending beyond said encapsulating means, said extending portions of said metallic members being formed and disposed in rows forming plug-in leads for the device.

13. The device of claim 12 wherein said substrate is formed of a material selected from the group consisting of glass, glass-ceramics, ceramics, and synthetic resins.

14. The device of claim 13 wherein said encapsulating means is formed of a dielectric material selected from the group consisting of glass, glass-ceramics, ceramics, and synthetic resins.

15. The device of claim 13 wherein said encapsulating means comprises a synthetic resin molded enclosure.

16. The device of claim 15 wherein at least one of said leadless electrical components is an electrical conductor.

17. The device of claim 16 wherein said conductive paths are formed of silver paint.

18. The device of claim 1 wherein at least one of said leadless electrical components is an active component.

19. The device of claim 18 wherein said active component is a transistor.

20. A method of forming an electrical circuit or network comprising the steps of:
providing a flat dielectric substrate, forming a plurality of apertures in said substrate communicating between the flat surfaces thereof, disposing a leadless electrical component having opposing terminal ends within each of at least two of said apertures so that at least one of the terminal ends of selected components extend beyond at least one of said flat surfaces of said substrate, providing a plurality of metallic members each having an aperture to accommodate a selected one of the extending terminal ends of said electrical components, electrically connecting said metallic members to said extending terminal ends of said selected ones of said components adjacent at least one of the flat surfaces of said substrate by disposing said extending terminal ends within said apertures, said metallic member, being fixedly maintained in electrical contact with said terminal ends by friction, each said metallic member providing an external electrical connection to one terminal of one component, and disposing a conductive path on at least one of the flat surfaces of said substrate electrically connecting the terminal ends of selected ones of said components in a desired manner.

21. The method of claim 20 further comprising the step of maintaining said electrical components within said apertures by means of friction.

22. The method of claim 20 further comprising the step of maintaining said electrical components within said apertures by a dielectric sealing compound.

23. The method of claim 20 further comprising the step of encapsulating the assembly so formed so that only portions of said metallic members extend beyond the encapsulant.

24. The method of claim 23 wherein said encapsulant is a synthetic resin molded about said assembly so formed.

25. The method of claim 20 wherein at least one of said leadless electrical components is an electrical conductor.

26. The method of claim 20 wherein at least one conductive path is formed on each of said flat surfaces of said substrate, each said conductive path electrically connecting said terminal ends of selected ones of said components in a desired manner.

27. The method of claim 26 wherein the size and shape of each said leadless electrical component and corresponding apertures in said flat dielectric substrate is such that said component is rigidly maintained within said aperture solely by friction, further comprising the steps of:

encapsulating the assembly so formed so that only portions of said metallic members extend beyond the encapsulant, and forming and disposing said extending portions of said metallic members in rows to form plug-in leads for the said circuit or network.

28. The method of claim 27 wherein said substrate is formed of a material selected from the group consisting of glass, glass-ceramics, ceramics, and synthetic resins.

29. The method of claim 28 wherein the encapsulant comprises a synthetic resin molded enclosure.

30. The method of claim 29 wherein at least one of said leadless electrical components is an electrical conductor.

31. The method of claim 29 wherein at least one of said leadless electrical components is an active component.

32. The method of claim 31 wherein said active component is a transistor.

* * * * *